United States Patent [19]

Beam et al.

[11] Patent Number: 4,480,990
[45] Date of Patent: Nov. 6, 1984

[54] ARTICLE SUPPORT RACK AND METHODS OF WEIGHTING DOWN ARTICLES

[75] Inventors: William D. Beam, Richmond; David C. Chrisman, Sandston; Lloyd R. Cox, Richmond; Charles R. Hankins, Sandston, all of Va.

[73] Assignee: AT&T Technologies, Inc., New York, N.Y.

[21] Appl. No.: 508,158

[22] Filed: Jun. 27, 1983

[51] Int. Cl.³ .......................... F27D 3/00; F27D 5/00; F26B 9/04; B02C 11/08
[52] U.S. Cl. ........................................ 432/9; 34/144; 100/92; 100/93 P; 432/125; 432/253
[58] Field of Search .................. 432/9, 125, 231, 239, 432/253; 34/143, 144; 100/92, 93 P

[56] References Cited

U.S. PATENT DOCUMENTS 2,586,474  2/1952  Moore ................................. 34/144
2,762,514  9/1956  McGinn ............................... 211/13
3,330,419  7/1967  Joseph ................................ 211/176

Primary Examiner—John J. Camby
Attorney, Agent, or Firm—W. O. Schellin

[57] ABSTRACT

An article support rack (10) has at least one article support (12), such as a shelf, which is horizontally slidable in a first frame (18). A second frame (29) is mounted for vertical movement relative to the first frame (18). At least one weight (26) is supported by such second frame (29) at a certain distance above the article support (12) when the first and second frame are in a first position relative to each other. Articles (24) such as circuit boards are placed on the article support (12), and the vertical position of the first and second frames are shifted to a second position relative to each other wherein the upper surface of the circuit boards is pushed against the respective weight to lift the weight off its support such that the weight rests on the circuit boards. In a treating chamber (22), for example a bake oven, pedestals retain the first and second frames in such second position, such that the weights rest on the circuit boards (24) during a drying process to prevent the circuit boards from becoming warped. The absence of similar pedestals outside the bake oven causes the two frames to shift back to the first position relative to each other when the support rack (10) is removed from the oven to remove the weights from the circuit boards and allow them to be unloaded from the rack.

16 Claims, 5 Drawing Figures

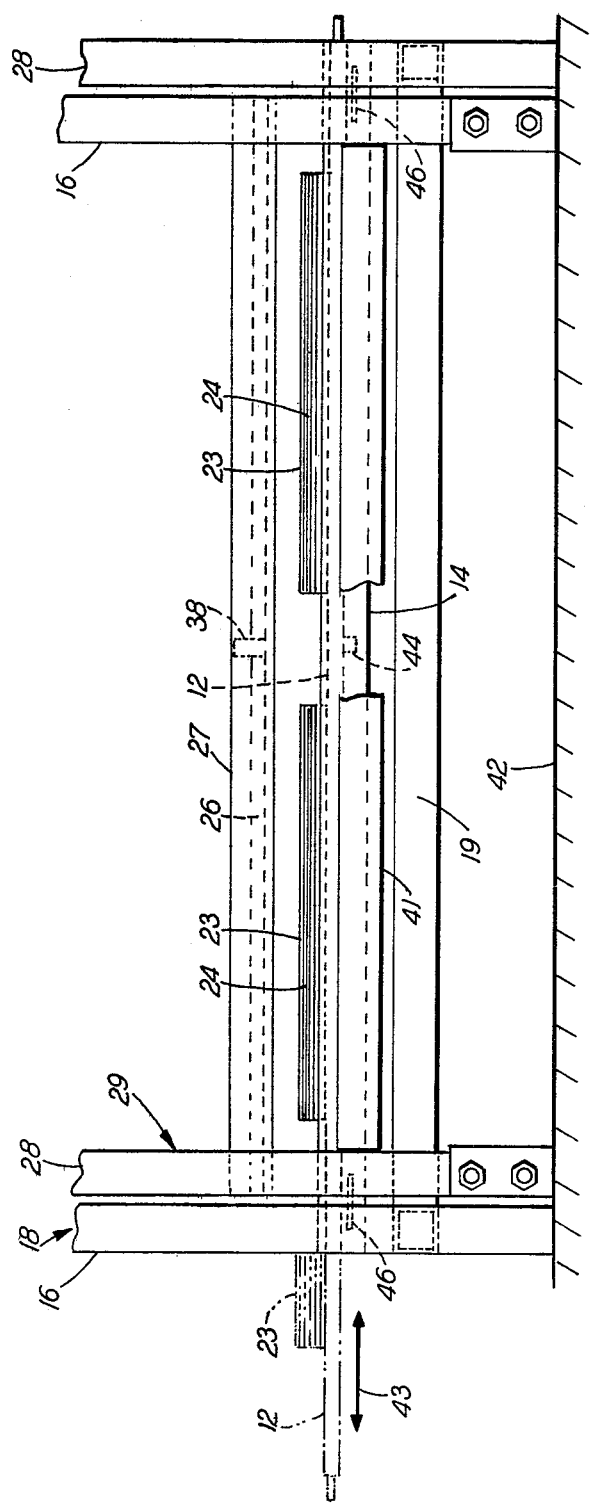

ARTICLE SUPPORT RACK AND METHODS OF WEIGHTING DOWN ARTICLES

TECHNICAL FIELD

This invention relates to an article support rack and to methods of weighting down articles. More particularly, the invention relates to a support rack for flat, sheet-like articles, such as printed circuit boards, and to methods of weighting down a stack of the boards, to substantially eliminate warping of the boards during or subsequent to a thermal process, such as, for example, a drying process.

BACKGROUND OF THE INVENTION

The manufacture of certain types of multi-layer circuit boards involves laminating a plurality of board layers, each of the layers having circuit patterns on both major surfaces thereof, into an interleaved structure with dielectric bonding layers. Such a laminating operation is typically a thermo-compressive operation. The laminated panels or blanks are further processed into multi-layer boards by such operations as, for example, drilling and metallizing via holes, and photo-lithographically defining circuit patterns in outer foil sheets of such blanks.

The laminated blanks and the completed multi-layer circuit boards exhibit a tendency to warp over a period of time. However, a drying operation included in the manufacturing process after the laminating step and after any subsequent wet treatments stabilizes the laminated structure sufficiently to eliminate any perceptible amount of warping. However, during the drying operation itself, the blanks need to be weighted down to retain their shape.

Thus, in accordance with existing techniques, a plurality of the blanks are loaded in stacks onto flat support surfaces in the form of shelves of a rack referred to as a baking rack. Each of the stacks of laminated blanks is then weighted down by a flat, distributive weight plate, which an operator places on top of each of the stacks in the rack. The rack, which is typically equipped with wheels or casters is then rolled into a room-size treating chamber, such as a baking oven.

Problems have been experienced in the past in that operators have been exposed to the possibility of injury while they lifted the weights onto the stacks, particularly while they lifted the weights to the uppermost shelves of the rack. Also, an oversight of an operator to weight down a stack of circuit board blanks prior to placing the rack into the baking oven causes such blanks to warp and renders the blanks useless.

SUMMARY OF THE INVENTION

Problems found in prior art practices are alleviated by a bake rack which embodies features of the present invention, and by improved methods of weighting down articles in preparation for a treating process.

In accordance with the invention, an article support rack features first and second support frames which are movable with respect to each other. At least one article support is mounted to the first frame, and at least one weight is spacedly supported by said second frame above and adjacent to said at least one article support. Thus, when an article is placed onto said at least one article support and said first support frame is raised with respect to said second support frame, the article moves into contact with the weight and the weight is lifted from a support of the second support frame, such that the at least one article is held down by the force of the weight.

A method of weighting down at least one article in accordance with the invention during a treating operation in a treating chamber includes loading such article outside of such chamber onto an article support into a space below a supported weight. The article support is then raised toward the weight to contact the article against the weight and to lift the weight from a support such that the weight becomes supported by the article. The article support, the article and the weight are then moved into the treating chamber and the article support remains in the raised position within the treating chamber.

BRIEF DESCRIPTION OF THE DRAWING

Various other features and advantages of the invention will be understood more readily when read in reference to the appended drawing, wherein:

FIG. 4 is a side view of the article support rack of FIG. 1 with an article support, in a load position outside of a treating chamber.

DETAILED DESCRIPTION

Figure 1:
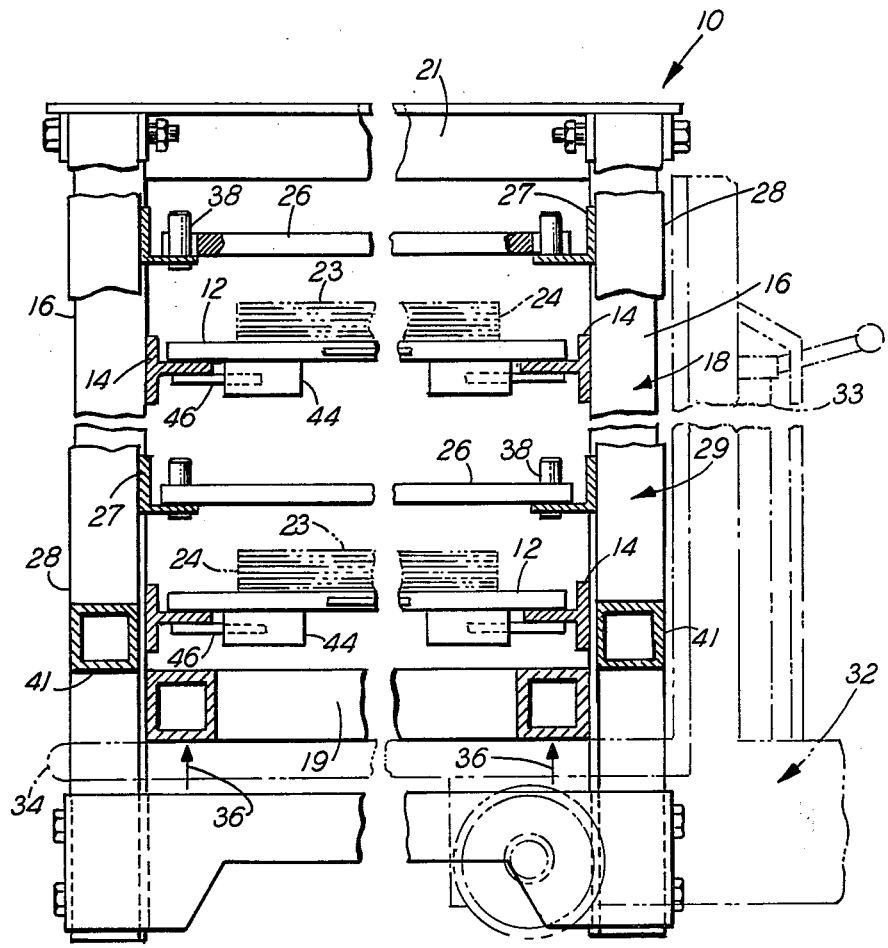
FIG. 1 shows an article support rack which embodies features of the present invention.

Referring to FIG. 1, there is shown a circuit board bake rack, designated generally by the numeral 10, which is a preferred embodiment and serves as an illustrative example of the invention. Various modifications in the structure of the apparatus and in the methods of application are possible without departing from the spirit and scope of this invention. The described circuit board bake rack 10, consequently, represents a preferred embodiment of various features and advantages of the invention embodied in an article support rack.

A plurality of shelves 12 of the rack 10 are slidably supported by guide rails 14. The guide rails 14 are welded to upright frame members, referred to as uprights 16, of an outer frame 18. Four corner uprights 16 of the outer frame 18 are held together in a typical manner by a lower cross frame 19 and an upper cross frame 21, such that the four uprights 16 establish the outer dimensions of the support rack 10.

The shelves 12 serve as article supports. The number of shelves 12 which are included in a typical rack 10 is determined by certain design parameters some of which are a matter of design choice. For example, the height of the rack 10 is limited to a predetermined height of a treating chamber 22 (see FIG. 5) which, in the preferred embodiment, is a bake oven. Other dimensions of the rack 10 are similarly affected by lateral dimensions of the bake oven 22 and by whether one or more of the racks 10 are to occupy the oven during a particular treating cycle.

Referring back to FIG. 1, vertical spacing of the shelves 12 is affected by the height of articles, as for example the height of a stack 23 of circuit boards 24 which are placed onto each of the shelves 12 in the rack 10. At a predetermined distance above each of the shelves 12 at least one weight plate 26 is supported by supports, such as weight support brackets 27. The weight support brackets 27, in turn, are rigidly fastened or mounted, such as by welds, to inner uprights 28 of an inner support frame 29.

The vertical spacing between the shelves 12 and the respective weight plates, more generally referred to as weights 26, provides a clearance between the uppermost circuit boards 24, when they are stacked onto the shelves 12, and the underside of such weights 26. Since each of the shelves 12 and the respective weight 26 is similarly arranged in the rack 10, it will be realized that the advantages of the invention are present in the combination of a single shelf and weight when mounted and used as described herein.

FIG. 1 further depicts a low-profile lift-truck 32 which may be moved into position beneath the lower cross frame 19 of outer frame 18. When a lift provision 33, such as, for example a typical hydraulic lift, is activated to raise a platform 34 against the lower cross frame 19, the cross frame and hence the outer frame 18 together with the shelves 12 is raised, as indicated by the arrows 36.

Figure 2:
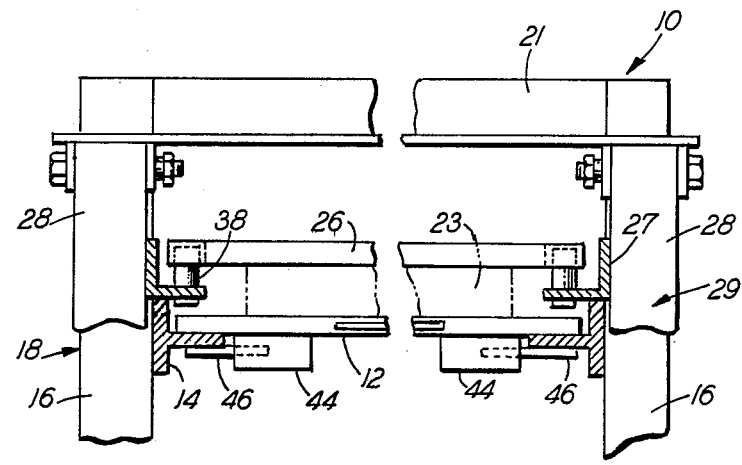
FIG. 2 shows in greater detail portions of the article support rack and shows particularly an article support and its positional relationship to a weight when articles are to be loaded onto the rack.

Referring now to FIG. 2, when the shelves 12 are raised and hence the circuit boards 24 move against the weights 26, the weights 26 are lifted off the weight support brackets 27, such that the weights now rest on and weight down the circuit boards 24. FIG. 2 further shows in greater detail guide pins 38 mounted to each of the weight support brackets 27 which retain the weights 26 in vertical alignment above their rest positions on the weight support brackets 27 once the weights 26 are raised away from the brackets 27.

Figure 3:
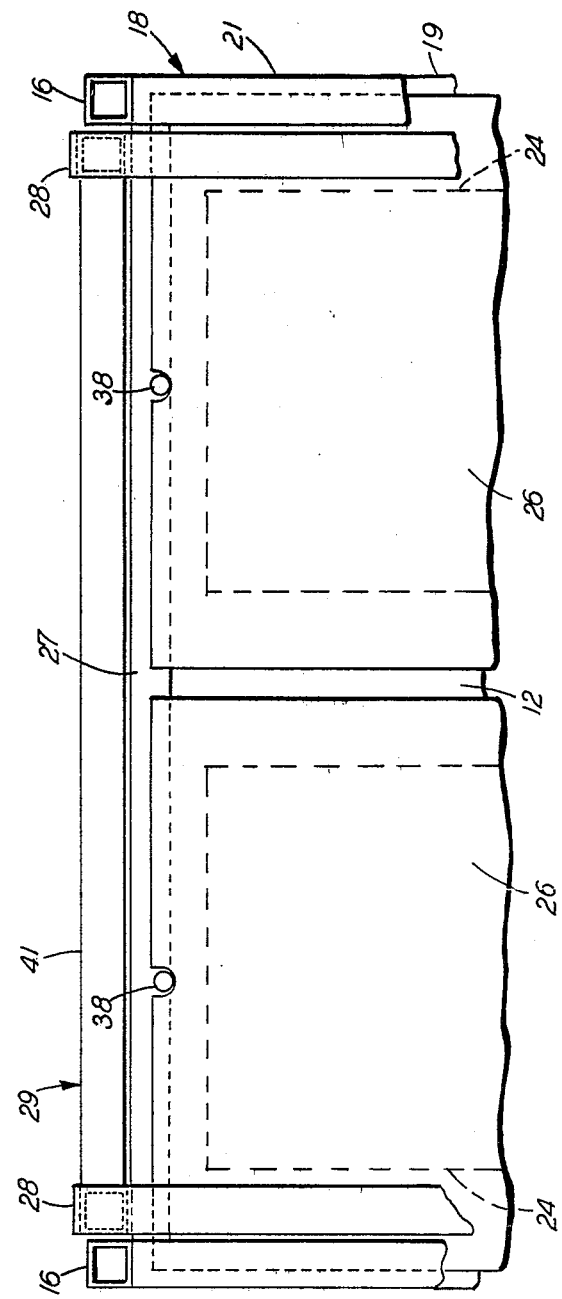
FIG. 3 shows a top view of one side of an article support rack, highlighting a nested structure of an inner frame guided by an outer frame and two separate weights in juxtaposition.

In the preferred embodiment, the weight support brackets 27 are permanently mounted to and are part of the inner support frame 29. The top view of a portion of the rack 10 depicted in FIG. 3 shows the inner support frame 28 as being guidedly nested within the uprights 16 of the outer support frame 18. Thus, in an initial raising of the outer frame 18, the outer frame 18 moves vertically with respect to the inner support frame 29 until the lower cross frame 19 moves up to the same plane as a lower inner base 41 of the inner support frame 29 (see FIG. 1). From there on the lift platform 34 supports both the inner support frame 29 and the outer frame 18, such that from there on they are raised together since both are fully supported by the lift-truck 32. In such fully supported position the outer frame 18 and the inner support frame 29 are substantially fixed with respect to each other, with uprights 16 of the outer frame 18 cradling the inner uprights 28 (see FIG. 3).

In addition to, or as an alternative to, supporting the lower inner base 41 by the lift platform 34 for joint vertical movement with the outer frame 18, structural members of the outer frame 18 such as the guide rails 14, may be spaced below the weight support brackets 27 by the distance necessary to be traversed by the outer frame 18 to raise the weights 26, as shown in FIG. 2. Any further lifting of the outer frame 18 by the lift truck 32 will lift both the outer frame 18 and the inner support frame 29 of the rack 10 in unison. When the rack 10 is in such raised position, the weights rest on the circuit boards 24 as shown in FIG. 2.

Figure 5:
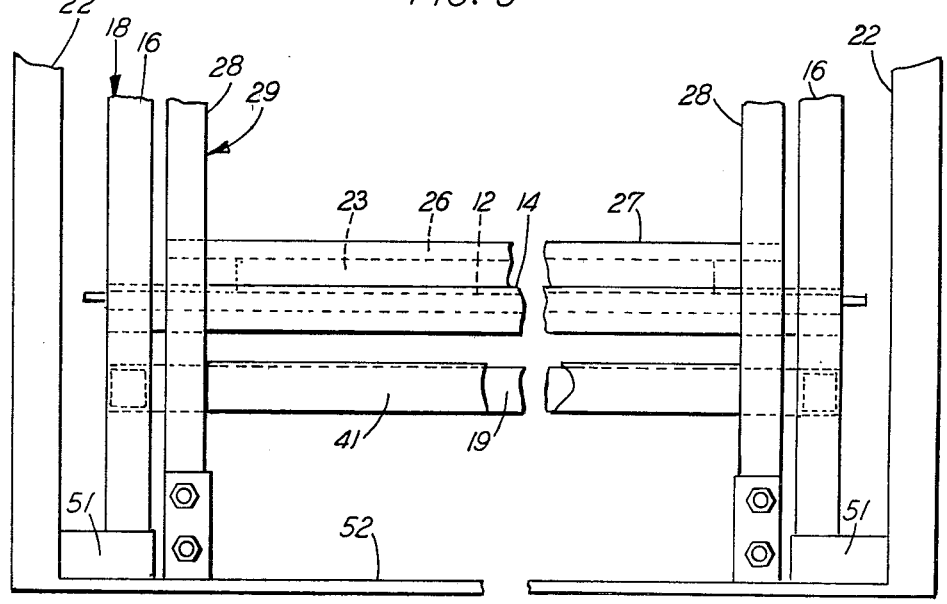
FIG. 5 is a side view of the article support rack of FIG. 1 after articles have been loaded onto the article support and the rack has been moved into a weight applying operational position within the treating chamber.

Advantages of the described structure of the rack 10 can be seen in a side view of the rack as depicted in FIGS. 4 and 5. In FIG. 4, the rack 10 is in its lowered position wherein the uprights 16 of the outer frame 18 and the inner uprights 28 of the inner support frame 29 are in contact with the same reference plane, such as a floor 42. Such lowered position of the rack 10 is referred to as its load position. When the rack 10 is in its load position, the shelves 12 may be pulled outward from their normal, retracted position within the confines of the outer uprights 16. When the shelves 12 are pulled out of the rack 10 as indicated by the arrow 43, a stop lug 44 mounted to and extending downward on two sides in the center of each shelf 12 moves into engagement with a respective stop 46 mounted to outer ends of the guide rails 14. Thus, each shelf 12 may be pulled from the rack up to approximately one half of its length through the rack 10 as shown in phantom lines in FIG. 4.

In a preferred loading operation, circuit boards 24 are loaded onto one shelf 12 at a time. The shelf 12 to be loaded is pulled out to one end of the rack 10 and circuit boards 24 are placed onto such pulled out half of the shelf 12 as shown in FIG. 4. The respective shelf 12 is then pushed back into the rack 10. Subsequently the shelves 12 are sequentially pulled out from the other end of the rack 10, and circuit boards are loaded onto the second ends 49 of the shelves 12 in a similar manner. The number of circuit boards 24 in each stack 23 is preferably the same. Consequently, the stacks 23 are all of substantially the same height so that a single weight 26 bears down evenly on two loaded stacks 23 of circuit boards 24, as shown in FIG. 4.

An alternate embodiment of the use of the weights 26 is shown in reference to FIG. 3. Two juxtaposed weights 26 are supported by the same weight support bracket 27 and are independently guided by a set of the pins 38. This latter embodiment illustrates that more than a single weight 26 can be associated with each of the shelves 12. In the latter embodiment, each of the stacks of the circuit boards 24 is associated with its respective weight 26, inasmuch as two weights 26 are mounted side by side, one over each end of each respective shelf 12. Thus when only one end of any of the shelves 12 is loaded with the circuit boards 24, the one weight 26 which is located directly above the loaded boards 24 will come to rest evenly thereon once the circuit boards 24 are raised against the weight 26.

The weights 26 are applied to the boards automatically after all of the circuit boards are loaded onto the shelves 12, and the lift truck 32 (see FIG. 1) raises the rack 10 from its normal rest position on the floor as shown in FIG. 4 to move the rack into the treating chamber 22 as shown in FIG. 5. In the treating chamber 22, pedestals 51 are located in spaced positions on a chamber floor 52. The horizontal spacing of the pedestals 51 corresponds to the horizontal spacing of the four uprights 16 of the outer frame 18. When the rack 10 is properly positioned in the treating chamber 22, the uprights 16 rest and become blocked in the raised position on the pedestals 51 while the inner uprights 28 rest on the chamber floor 52.

Thus, when the raised rack 10 is lowered after the rack is wheeled into the chamber 22, the outer uprights 16 come to rest on the pedestals 51. The height of the pedestals 51 is determined to be substantially as high so as to retain the relative vertical positions between the outer frame 18 and the inner support frame 29, and to allow the inner uprights 28 to contact and rest on the floor 52 when the outer frame 18 comes to rest on the pedestals 51.

Outside of the treating chamber, when the rack 10 is lowered to the floor 42 as shown in FIG. 4, the circuit boards 24 are automatically separated from the weights 26 and the weights are returned to their normal, supported positions on the weight support brackets 27. The weights 26 are at no time handled by an operator. The treating process of the circuit boards 24, consequently, no longer involves a deliberate application of a weight 26 to a stack of circuit boards 24 after the boards have been loaded onto a support of a prior art rack or a deliberate removal of the weights 26 from such stacks after the completion of the treating process.

An automatic removal of the weights after the completion of the treating process in the described preferred example is particularly advantageous, since the treating process is a thermal process and the weights 26 are not only heavy considering the strength of a typical operator, but they are also hot. The described structure and handling methods of the circuit boards 24 are consequently seen to advantageously limit hazards to which an operator is exposed.

A further advantage of the described structure and process is realized through efficiencies in the cycle time of loading the circuit boards 24 into the rack 10 and then unloading them at the completion of the treating cycle. Since the weights are not handled, either during loading or during unloading the circuit boards 24, the total time interval to unload the treated boards and reload new ones to be treated, such interval being also referred to as turn-around time, is minimized.

The minimized turn-around time not only permits a percentage-wise greater process throughput but allows the rack 10 to be returned to the treating chamber before it cools down to room temperature. Since the weights 26 above each of the shelves 12 remain in a vertically stacked arrangement within the rack 10, the thermal energy stored in the weights 26 is dissipated at such a slow rate that the rack 10 can be returned to the treating chamber 22 before a substantial portion of the energy is lost.

From the above description various changes and modifications within the spirit and scope of the invention come to light. For example, as explained above, the size of the shelves 12, their vertical spacing or the number of shelves within the rack 10 is clearly a modification within the scope of the invention. In addition to the size of the shelves 12, the shape of the shelves as flat plates is merely an illustrative example of the described, preferred embodiment of the invention. The flatness of the shelves 12 and of the weights 26 is significant to the described embodiment in that the circuit boards 24 are weighted down to retain their flat shape. If, on the other hand, articles other than the circuit boards 24 have a non-planar shape, the lower support surface instead of being a flat shelf ideally nests the article, whatever shape it may have. Similarly, the weight 26 is ideally shaped complementary to the shape of the upward facing portion of the article, such that the force of the weight becomes evenly distributed over the surface of such article.

A specifically described example of the treating chamber is a bake oven. In a typical manufacturing process, the circuit boards 24 are subjected to the bake cycle at typically 300° F. for 1 hour. The typical process time and temperature are preferred values which have been established for stacks which are approximately 2.5 centimeters thick. The drying operation typically follows the lamination process of multi-layer circuit boards and is preferably repeated after subsequent wet treatments of the boards such as chemical etching and rinsing operations.

It is to be realized, however, that the described features of weighting down articles may be advantageous for operations other than the referred-to bake operation. Consequently, the treating chamber may be any locus for subjecting an article to an operation during which it may be desirable to weight down the article. Of course, other changes and modifications are deemed possible without departing from the scope and spirit of the invention.

What is claimed is:

1. An article support rack, which comprises:
   first and second support frames mounted to translate vertically with respect to each other;
   at least one article support mounted to the first frame, said article support having an upper support surface adapted to receive at least one article and to support the shape of said at least one article loaded thereon; and
   at least one weight supported by said second frame in a spaced position above and adjacent to said at least one article support and said at least one article upon having been loaded onto said article support, said first frame guided for movement with respect to said second frame to raise said at least one article support and said at least one article loaded thereon toward and into forced contact with said at least one weight, such that said at least one weight is raised from said second frame to rest on said at least one article upon such movement of said first frame to raise said at least one article support.

2. An article support rack according to claim 1, wherein at least one article support comprises a plurality of vertically spaced article supports each being mounted to said first frame; and
   wherein at least one weight comprises a plurality of vertically spaced weights, such weights being supported by said second frame in an interleaved arrangement with said plurality of article supports wherein each of such weights is supported in said spaced position above and adjacent to a respective one of said article supports.

3. An article support rack according to claim 2, wherein said first and second support frames comprise, respectively, an outer and an inner frame, said outer frame having uprights which are fixedly mounted with respect to each other by a plurality of horizontal cross members, said uprights of said outer frame forming outer corners of said article support rack, said inner frame having uprights adjacent to and parallel to and pairwise cradled within two respectively adjacent ones of said uprights of said outer frame, such that said uprights of the inner and outer frames mutually guide the frames in vertical movement with respect to each other.

4. An article support rack according to claim 3, wherein the outer frame comprises:
   means for supporting a frame-raising force to move said outer frame vertically with respect to said inner frame and to raise a plurality of articles loaded onto said plurality of article supports into forced contact with said plurality of weights; and means for contacting said outer frame and said inner frame subsequently to said plurality of articles having been raised into forced contact with said weights, such that said weights are raised from said inner frame, to jointly move the outer and inner frame while said contacting means maintains contact between said outer and inner frames.

5. An article support rack according to claim 3, wherein the outer frame comprises means for supporting a frame-moving force to move said outer frame vertically with respect to said inner frame, and wherein the inner frame comprises means for supporting a frame-moving force to move said inner frame together with said outer frame, said supporting means of said inner frame being vertically offset from said supporting means of said outer frame to remain protected from said frame-moving force until after the outer frame has been raised a first predetermined distance to raise said plurality of articles into forced contact with such plurality of weights, such that said plurality of weights are raised from said inner frame and rest on said contacting articles.

6. An article support rack according to claim 5, which further comprises means for arresting movement of said outer frame with respect to said inner frame, said movement arresting means becoming effective during movement of said outer frame in the direction for moving a plurality of articles loaded onto said plurality of article supports into forced contact with said weights upon said articles having moved into forced contact with said weights.

7. An article support rack according to claim 6, wherein said plurality of article supports comprises a plurality of shelves having flat upper surfaces, and said plurality of weights comprises a plurality of flat plates which are supported substantially parallel to such upper surfaces, such that the shelves are adapted to support a plurality of flat articles, such as multi-layer circuit boards.

8. An article support rack according to claim 7, wherein each of said shelves comprises a stop mounted to such shelf, said shelves being horizontally slidably mounted within said outer frame to slide outward from said frame until said stop engages said outer frame.

9. An article support rack according to claim 8, wherein each of said shelves supports a plurality of such articles in at least two adjacent locations and at least two of said plurality of weights are supported above and adjacent to each of such shelves.

10. An article support rack which comprises:
first and second support frames mounted to translate vertically with respect to each other;
a plurality of article supports mounted to said first frame, each of said article supports having a support surface adapted to receive and support at least one article thereon;
a plurality of weights supported by said second frame in spaced positions above and adjacent to said article support, such that at least one of said weights is associated with each of said article supports; and
means for moving said first frame relative to said second frame to move said article supports toward and away from said respective weights, such that upon movement of the article supports toward the weights, articles supported by such article supports are urged into contact with adjacent ones of such weights.

11. An article support rack according to claim 10, wherein means for moving said first frame comprises means for moving said article supports and in the direction toward the weights in a movement adapted to cause articles supported by such article supports to lift the contacted weights away from supportive engagement with such second frame, whereby the weights come to rest on adjacent ones of such articles.

12. An article support rack according to claim 11, wherein the article support rack is a circuit board support rack and each of the article supports is a shelf, such shelf being slidably held within said first frame and said weights are flat weight plates which are vertically interdigitated with said shelves, such that at least one of said weights is supported above each of said shelves, and wherein each shelf is adapted to slide to protrude at least partially from a vertically interdigitated position with such shelves and weights thereby allowing at least one of the circuit boards to be placed on top of the protruding portion of the shelf.

13. An article support rack according to claim 12, further comprising means for arresting vertical translation between said first and second frames in a first position wherein said shelves are spaced from said adjacent weights by a space greater than the height of circuit boards to be placed on such shelves and in a second position wherein said weights are urged away from supportive engagement with the second frame and rest against adjacent ones of the circuit boards on the shelves.

14. An article support rack according to claim 13, wherein the means for arresting vertical translation comprises:
frame legs of said first and second frames of a predetermined length from the foot of such legs to the shelves on said first frame and to the weights on said second frame, respectively, such that the first and second frames are in said first position with respect to each other when said frame legs of said first and second frames rest on a planar support surface; and
a first stop mounted to said first frame and a second stop mounted to said second frame in the path of said first frame, such that the stops contact each other in motion arresting engagement when the first and second frame are in said second position.

15. A method of weighting down articles for treatment, which comprises:
placing articles to be treated onto an article support in spaced relationship below a weight resting on a support frame;
raising the article support to move a top surface of the articles into contact with the weight;
raising the weight off the support frame to rest the weight on the articles;
moving said article support and said support frame between a load station at which the articles are placed onto said support and a treating station at which the articles undergo said treatment while maintaining said article support in such raised position wherein the weight is raised off the support frame; and
blocking relative movement between the article support and the support frame while the article support and support frame are located at said treating station to retain the weight on such articles during treatment at such treating station.

16. A method of weighting down articles according to claim 15, further comprising:

after moving said article support and said support frame from said treating station to said load station, lowering said article support with respect to said support frame; and unloading treated articles from said article support prior to the step of placing articles to be treated onto the article support.

* * * * *